United States Patent
Hakey et al.

(10) Patent No.: US 6,420,748 B1
(45) Date of Patent: *Jul. 16, 2002

(54) BORDERLESS BITLINE AND WORDLINE DRAM STRUCTURE

(75) Inventors: Mark C. Hakey, Milton; David V. Horak, Essex Junction, both of VT (US); William H. Ma, Fishkill, NY (US); Wendell P. Noble, Jr., Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/657,968

(22) Filed: Sep. 8, 2000

Related U.S. Application Data

(62) Division of application No. 09/052,538, filed on Mar. 31, 1998, now Pat. No. 6,175,128.

(51) Int. Cl.$^7$ ............................................. H01L 27/108
(52) U.S. Cl. ........................................ 257/296; 257/773
(58) Field of Search ................................ 257/296, 773

(56) References Cited

U.S. PATENT DOCUMENTS

| | | |
|---|---|---|
| 5,055,898 A | 10/1991 | Beilstein, Jr. et al. |
| 5,214,603 A | 5/1993 | Dhong et al. |
| 5,320,975 A | 6/1994 | Cederbaum et al. |
| 5,389,566 A | 2/1995 | Lage |
| 5,460,994 A | 10/1995 | Kim |
| 5,516,719 A | 5/1996 | Ryou |
| 5,521,117 A | 5/1996 | Kapoor |
| 5,959,319 A | * 9/1999 | Iwasa ........................ 257/296 |
| 6,175,128 B1 | * 1/2001 | Hakey et al. ............... 257/296 |
| 6,271,555 B1 | * 8/2001 | Hakey et al. ............... 257/302 |

* cited by examiner

Primary Examiner—Mark V. Prenty
(74) Attorney, Agent, or Firm—William N. Hogg

(57) ABSTRACT

It is a feature of the present invention that a subminimum dimension wordline links approximately minimum dimensional individual gate segments with the bitline contact being borderless to the wordline.

It is still a further object of the present invention to provide a transistor with an individual segment gate conductor and a subminimum dimension gate connector with the bitline contact being borderless to the wordline.

A semiconductor structure and method of making same comprising a DRAM cell which has a transistor which includes a gate. The gate comprises an individual segment of gate conductor such as polysilicon on a thin dielectric material. The transistor further comprises a single crystal semiconductor substrate having a source/drain region. An active conductive wordline is deposited on top of and electrically contacting the segment gate conductor with the wordline being a conductive material. Insulating material completely surrounds the active wordline except where the active wordline contacts the segment gate conductor. A bitline contact contacting the insulating material surrounds the wordline contact in the source/drain region to thereby make the bitline contact borderless to the wordline.

3 Claims, 4 Drawing Sheets

US 6,420,748 B1

BORDERLESS BITLINE AND WORDLINE DRAM STRUCTURE

RELATED APPLICATIONS

This application is a divisional of application Ser. No. 09/052,538, filed Mar. 31, 1998 and now U.S. Pat. No. 6,175,128.

FIELD OF INVENTION

This invention relates generally to DRAM cell design using transistors and semiconductor interconnection techniques, and more particularly to a conductive wordline for a DRAM cell and a method of making the same wherein the bitline contact is borderless to the wordline which is especially useful in folded-bitline architecture for DRAMS.

BACKGROUND OF THE INVENTION

Large numbers of DRAM cells must be interconnected with wordlines, and wordlines and spaces between wordlines are determinative of the size of a folded-bitline cell. Typically, wordlines are formed as thin films of a conductor, such as aluminum or polysilicon, deposited on insulating materials on the semiconductor surface and defined as lines photolithographically. Efforts to shrink wordlines and the spaces between wordlines are limited since both line widths and spaces cannot lithographically be made smaller than the minimum photolithographically defined line. While it is possible to decrease the line width, for example, decreasing the line width usually increases the line-to-line spacing and so the overall wordline pitch is not improved. The cost of decreasing the photolithographic minimum dimension is high, and each such effort has defined succeeding generations of semiconductor products. In each generation of DRAM cells, the photolithographically defined wordline and it's associated space have each thus been formed at the photolithographic minimum. Each such effort has defined succeeding generations of semiconductor products. As the capacitor, transfer device, and associated isolators continue to shrink past the wiring 8 squares limit, the lithographically formed planar wiring will limit the ultimate DRAM cell size. A one device and one capacitors folded DRAM cell is comprised of three discrete connections (wires) and a capacitor plate. The three wires is include two wordlines and one bitline or one wordline and two bitlines. The packing of the wires is one of the main determinants of the DRAM cell size.

In the folded-bitline DRAM cell design, both an active and a passing wordline pass through each cell, as illustrated in commonly assigned U.S. Pat. No. 4,801,988 ("the '988 patent"), issued to D. M. Kenney, entitled "Semiconductor Trench Capacitor Cell with Merged Isolation and Node Trench Construction," and shown therein which is incorporated herein by reference. Crossing over trench capacitors 505A and 510A for a pair of cells in FIG. 1, are wordlines 515A and 520A. The space required for such a DRAM cell is a minimum dimension for each of the two wordlines in each cell and an additional minimum dimension for each space between each wordline. Thus the total minimum length of the traditional cell is 4 minimum dimensions. The width of the cell is at least two minimum dimensions, of which one is for the components in the cell and the other is for a thick isolation (a trench capacitor can be a part of this isolation) as well as for the bitline connector between bitlines and in the space between cells. Thus, the minimum area of a traditional DRAM cell has been 8 square minimum dimensions, or 8 squares.

One approach to avoid the photolithographic limit is to provide a wordline formed of a conductive sidewall rail. The width of such rails is determined by the thickness of the deposited conductor, and this thickness can be significantly less than a minimum photolithographic dimension. Commonly assigned U.S. Pat. No. 5,202,272 ("the '272 patent"), issued to Hsieh, entitled "Field Effect Transistor Formed With Deep-Submicron Gate," and U.S. Pat. 5,013,680 ("the '680 patent"), issued to Lowrey, entitled "Process for Fabricating a DRAM Array Having Feature Widths that Transcend the Resolution Limit of Available Photolithography," all of which are incorporated herein by reference, teach methods of using a subminimum dimension conductive sidewall spacer rail to form a wordline.

One problem encountered in the use of such subminimum dimension spacer rail wordlines is the difficulty of precisely controlling the length of the device and the extent of lateral diffusion of the source and drain. For example, small variations of spacer thickness or lateral diffusion can result in a large variation in the length of the subminimum dimension channel. The result can be large leakage currents on the one hand and degraded performance on the other. The present invention avoids the difficulties of the subminimum dimension sidewall spacer rail wordlines of the prior art.

Moreover, prior art structures and techniques for sublithographic wordlines and/or bitlines do not provide the bitline contact being borderless to the wordline.

SUMMARY OF THE INVENTION

It is, therefore, an object of the present invention to provide a folded-bitline DRAMA cell with a photolithographically formed gate, the cell having an area of less than 8 squares with the bitline contact being borderless to the wordline.

It is also a feature of the present invention that a subminimum dimension wordline links approximately minimum dimensional individual gate segments with the bitline contact being borderless to the wordline.

It is still a further object of the present invention to provide a transistor with an individual segment gate conductor and a subminimum dimension gate connector with the bitline contact being borderless to the wordline.

These and other objects of the invention are accomplished by semiconductor structure comprising a DRAM cell which has a transistor which includes a gate. The gate comprises an individual segment of gate conductor such as polysilicon on a thin dielectric material. The transistor further comprises a single crystal semiconductor substrate having a source/drain region. An active conductive wordline is deposited on top of and electrically contacting the segment gate conductor with the wordline being a conductive material. Insulating material completely surrounds the wordline except where the wordline contacts the segment gate conductor. A bitline contact contacting the insulating material surrounds the wordline contact in the source/drain region to thereby make the bitline contact borderless to the wordline. The present invention also provides a method of making such a DRAM cell.

DETAILED DESCRIPTION OF THE INVENTION

FIGS. 1 through 12 show diagrammatically the steps in forming a DRAM cell according to the present invention.

The preferred illustrated embodiment utilizes a silicon wafer with silicon technology to form the cells, however, germanium and gallium arsenide or others could also be used. However, silicon is the most widely and commonly used material, so the invention will be described with respect to the use of silicon.

The term horizontal as used herein is defined as a plane parallel to the conventional planar surface of the semiconductor chip or wafer, regardless of the orientation of the chip. The term vertical refers to a direction generally normal or perpendicular to the horizontal as defined above. Prepositions such as "on", "side", (as in "sidewall"), "higher", "lower", "over", and "under" are defined with respect to conventional planar surfaces being on the top surface of the chip or wafer, irrespective of the orientation of the chip.

The folded-bitline DRAM architecture is one example of an array of transistors for which the present invention is applicable. The present invention provides a DRAM cell with a transistor having a gate formed from an individual segment of gate conductor and has a length (within overlay tolerances) and a width of about 1 minimum dimension. A wordline interconnecting such segment gates and the space between the active and passing wordlines each have a subminimum dimension as a result of the wordline being formed by a directional etch of conformably deposited conductor along the sidewall. The wordline also is encased in a dielectric or insulating material which makes the wordline borderless to the bitline contact. While the formation of just two array transfer devices is shown, it is to be understood that the array has many cells formed this way which are interconnected.

The figures in the present invention show the steps and the process of fabricating a DRAM cell of the present invention. Initial process steps in the manufacture of the invention are illustrated in FIGS. 3–10 of commonly assigned U.S. Pat. No. 5,264,716 ("the '716 patent"), issued to D. M. Kenney entitled "Diffused Buried Plate Trench DRAM Cell Array," incorporated herein by reference. In the '716 patent, however, a whole wordline is defined by a masking step. In the present invention individual rectangular or square gate stack segments instead of the whole wordline are defined by that masking step, each segment having only a single gate for a single transistor. Preferably the gate segments have dimensions of about 1 minimum dimension in each direction along the planar surface (or a little more) to accommodate overlay tolerances, and the gates are aligned to fill the minimum dimension space between trench capacitors.

Figure 1:
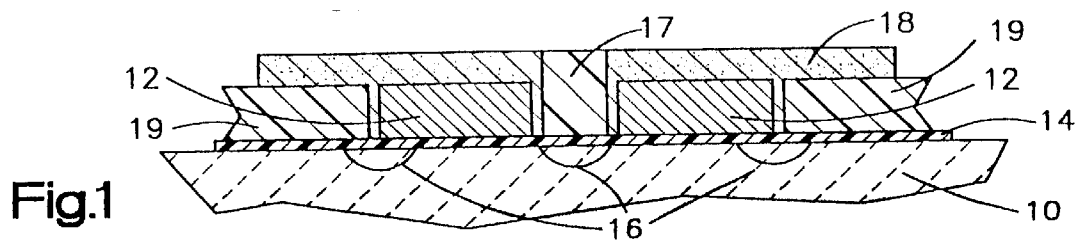
FIGS. 1 through 12, are longitudinal sectional views showing the steps in the process for forming a DRAM cell with a transistor in accordance with the present invention.

Referring now to FIG. 1, a monocrystal silicon substrate 10 is provided on which are shown two polysilicon gates 12 mounted on a thin dielectric material 14 on the substrate 10. A source/drain region 16 is shown on the substrate next to the two gates 12. A deposit of silicon dioxide 17 is formed on the substrate 10 between the two gates 12. Dielectric material 19 is "behind" and "in front" of gates 12 as well as on the sides thereof. (It is to be understood that other devices such as capacitors and the like and straps and connections are typically found in the substrate and form a part of the DRAM cell, but these are omitted for clarity of description.)

Figure 2:
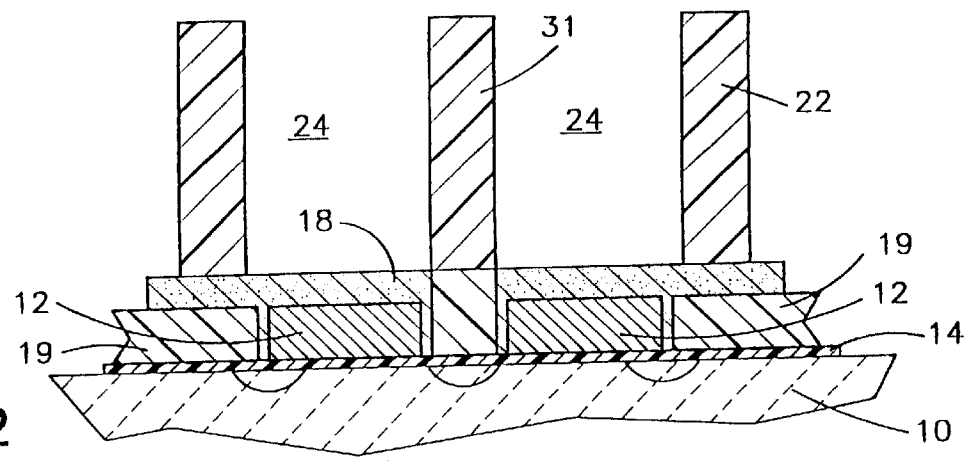

A layer of silicon nitride 18 overlies the gates 12 and the silicon dioxide deposit 17. Typically, the gates 12 are 500–1500 angstroms thick. Vertical sides of gates which are shown in FIG. 1, are further surrounded by silicon nitride spacers 50–400 angstroms thick fully encasing the gate material 12. The dielectric layer 14 is 50–80 angstroms thick and the nitride layer 18 is 300–800 angstroms thick. As shown in FIG. 2 a layer of silicon dioxide 22 4000–8000 angstroms thick is deposited over the silicon nitride layer 18. Resist is applied and patterned by photolithographic technique and anisotropic etching openings 24 are etched into the silicon dioxide 22 using the silicon nitride 18 as an etch stop. The size of the openings 24 are between 1 and 2 minimum dimension which can be exposed and developed by photolithographic techniques, and as will become apparent later, provide the basis for two wordlines in lithographic dimension.

Figure 3:
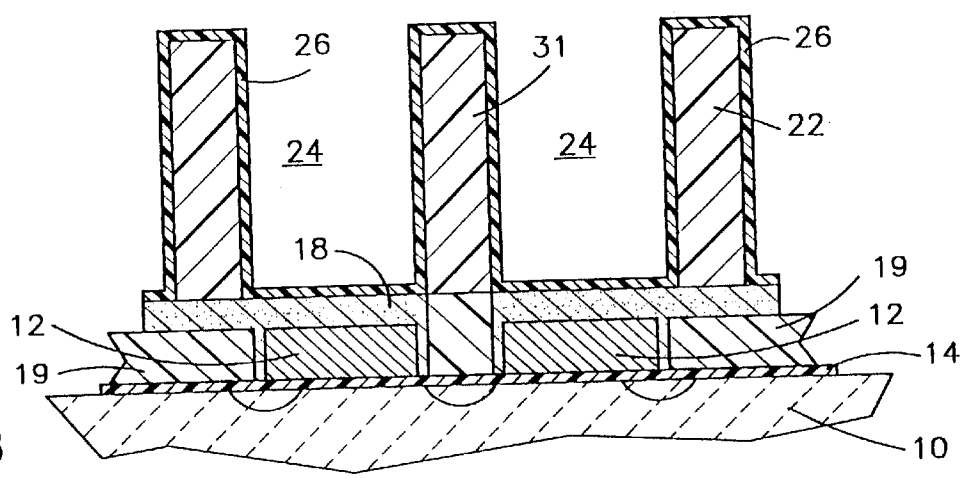

FIG. 3 shows a conformal coating 26 of silicon nitride which is deposited over all of the exposed surfaces of the silicon dioxide 22 and on top of the silicon nitride layer 18. The coating 26 is about 100–400 angstroms thick.

Figure 4:
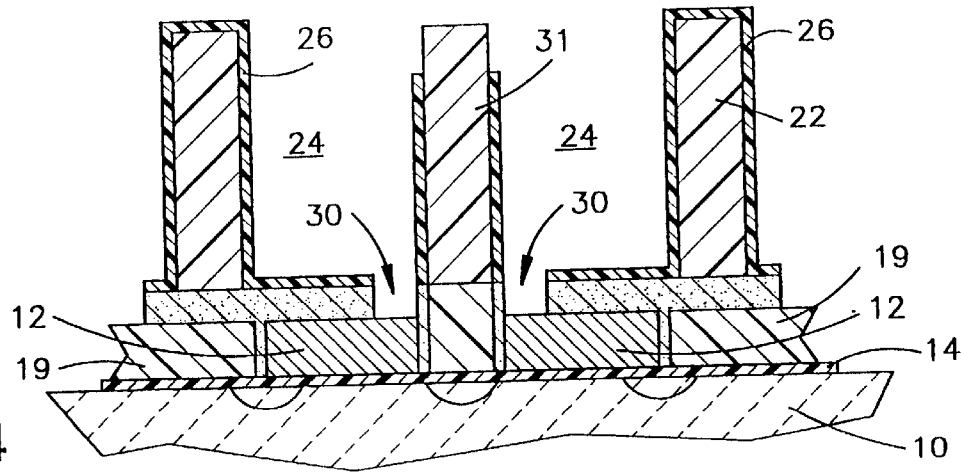

Following this step, and using photoresist and photolithographic techniques, the silicon nitride layers 26 and 18 have openings 30 etched therein to reveal the surface of the gates 12 as shown in FIG. 4. This etching will also remove a portion of the silicon nitride from the sidewalls of the silicon dioxide 22 on the partitions 31 overlying the source/drain region 16.

Figure 5:
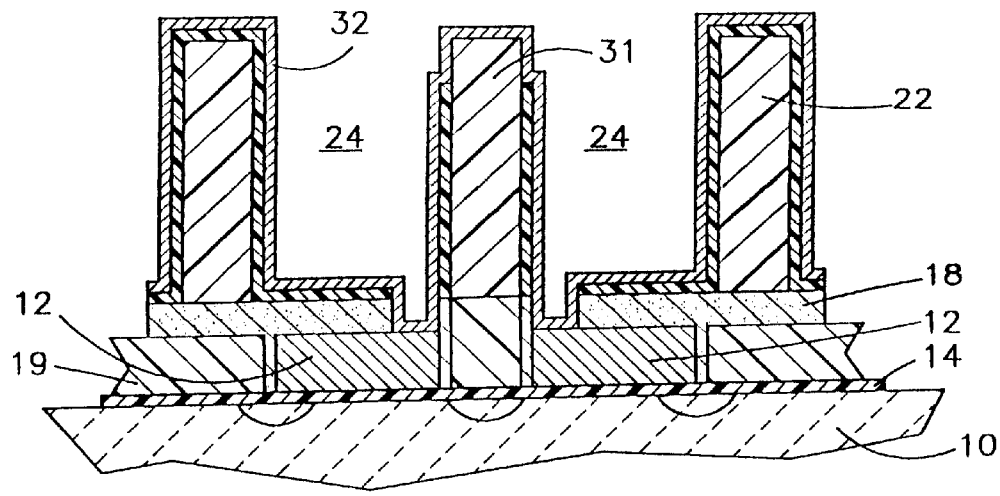

Following this etching of the openings a conformal coating of titanium nitride 32 about 50–300 angstroms thick is deposited onto the wafer both on the horizontal areas and the vertical on sidewall areas to provide the necessary conductive material to guarantee shunting of aluminum with a thin layer on the sidewalls but enough to guarantee a barrier layer between aluminum conductor material and the polysilicon gate if necessary. This is shown in FIG. 5.

Figure 6:
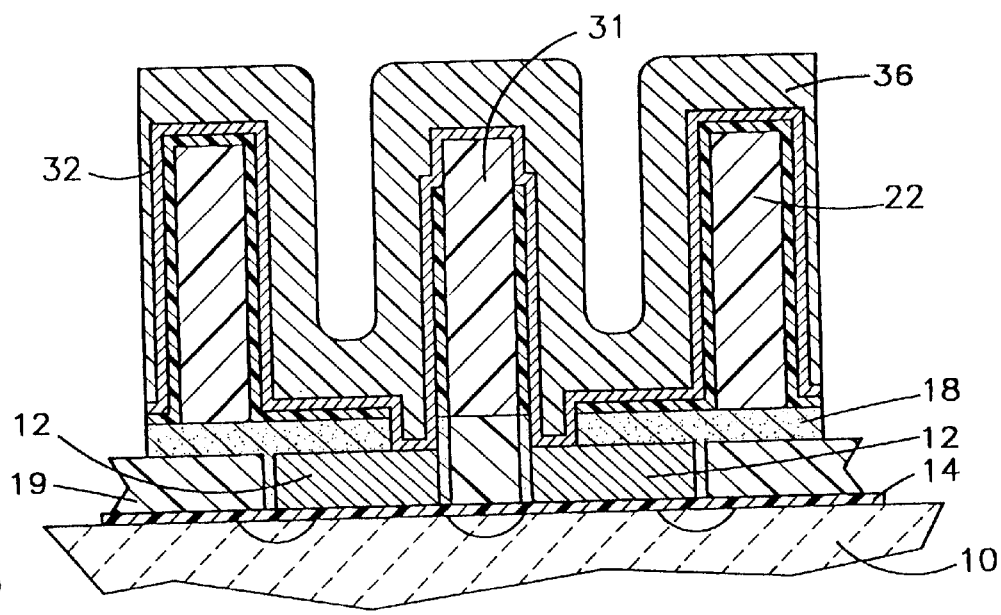
Figure 7:
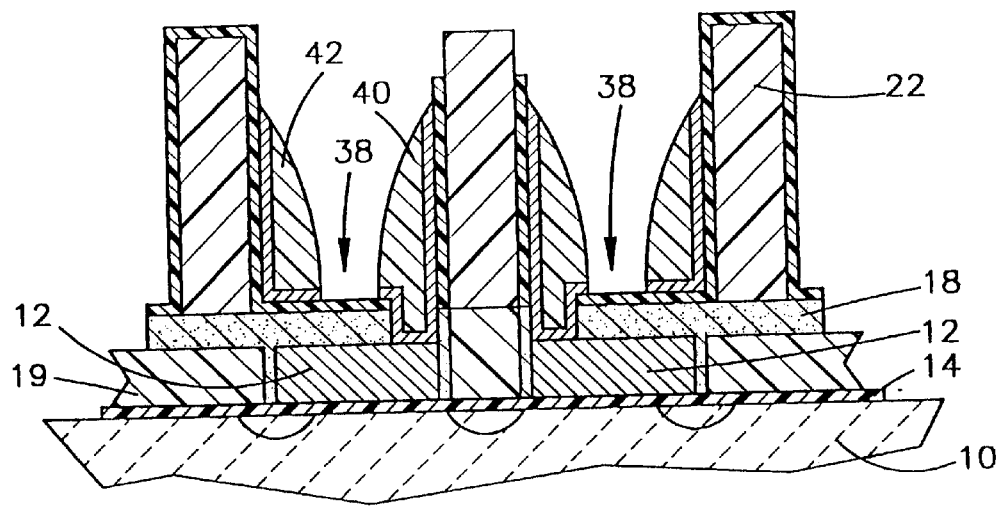

Following the deposition of the titanium nitride 32 a conformal layer of a conductive material preferably aluminum 36 is deposited over the titanium nitride 32 both within the openings 24 and on horizontal surfaces of the titanium nitride as shown in FIG. 6. Following this deposition, the aluminum 36 is anisotropically etched as shown in FIG. 7 to form an opening 38 in the aluminum in each of the openings 24 which separates the aluminum that had been deposited therein into a first leg 40 and a second leg 42 electrically isolated from each other. This anisotropic etching will not only etch away the material at the bottom of each of the openings 24, but will etch down the aluminum on the vertical walls of the silicon dioxide 22 as shown in FIG. 6. This etching will also etch the titanium nitride 32 to the same level as aluminum on the silicon nitride layer 26 as it is exposed and utilizes the silicon nitride 26 as an etch stop. Thus, the titanium nitride separating the two conductors 40 and 42 is etched so as to prevent conductive contact between the conductors 40 and 42. This is shown in FIG. 7. At this point, the conductor 42 of aluminum or other conductor material is in contact with the gate polysilicon 12, and thus will serve as an active wordline. The second leg 42 although a conductor, is spaced above and insulated from the gate polysilicon 12 by the silicon nitride layers 18 and 26 and thus will serve as a passing wordline. Thus at the limit, the active wordline and passing wordline are both contained within one minimum lithographic dimension. It should be noted at this point both the active wordline 40 and the passing wordline 42 extend to other devices, wherein the active wordline becomes the passing wordline and vise-versa, as is well known in the art.

However, adjacent wordlines 40 and 42 are a part of the same loop and need to be separated. A lithographic mask is now used to open loops at the edges of the DRAM arrays, and aluminum and titanium nitride are isotropically etched producing two discrete conductors from the loop.

Figure 8:
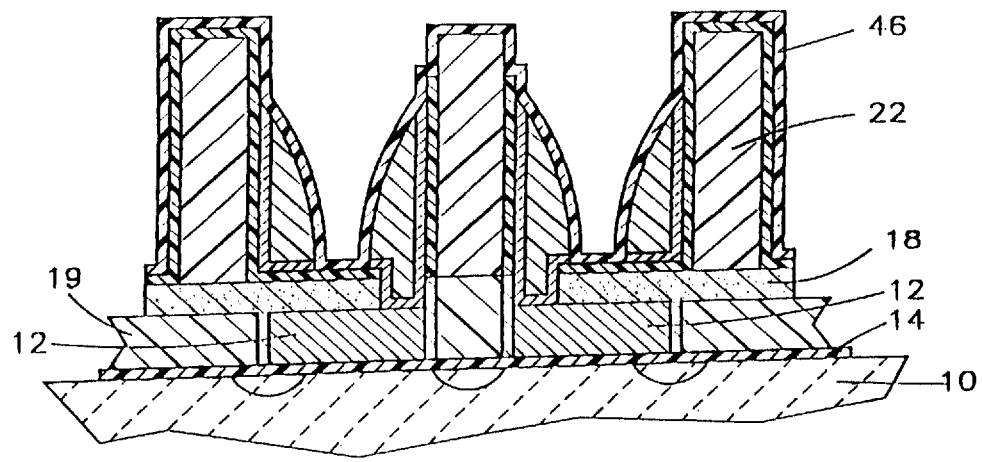

Following the etching of the aluminum 36 to form the active wordline and passing wordline, the following steps are taken to make the wordlines and especially the active wordline 40 borderless to a bitline contact which will be formed as presently described. To this end, a layer of insulating material 46 preferably silicon nitride about 100–500 angstroms thick is deposited over the top of the silicon dioxide 22 and into the openings 24 so as to complete the cover and surround all of the exposed surfaces of the first conductor 40 and second conductor 42 except that portion of the conductor 40 which contacts the gate polysilicon 12. This will provide complete and total encapsulation of the conductors 40 and 42, and thus will provide encapsulation of the active wordlines and passive wordlines 40 and 42 with silicon nitride. This is shown in FIG. 8. Preferably the silicon nitride is deposited by conformal silicon nitride depositing techniques.

Figure 9:
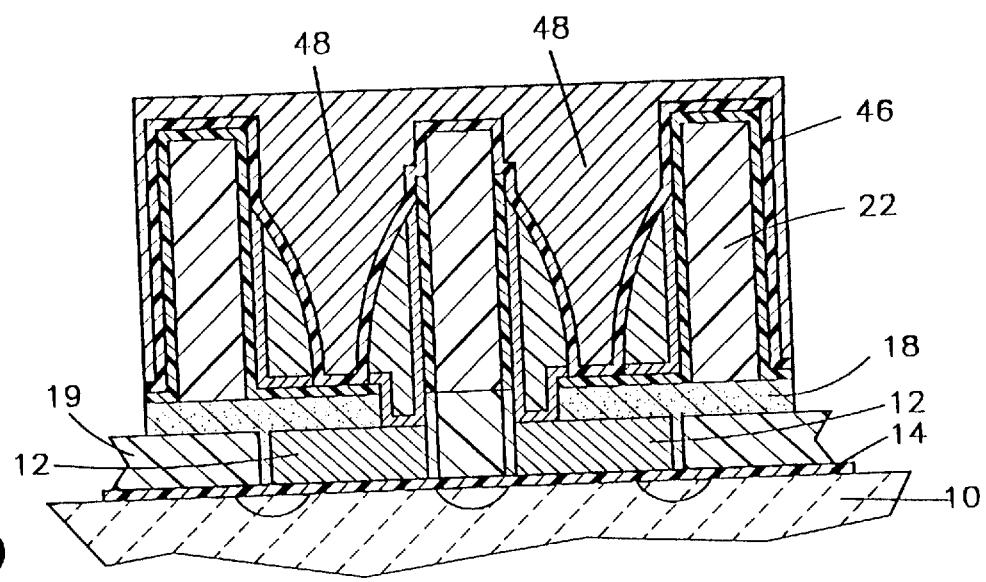
Figure 10:
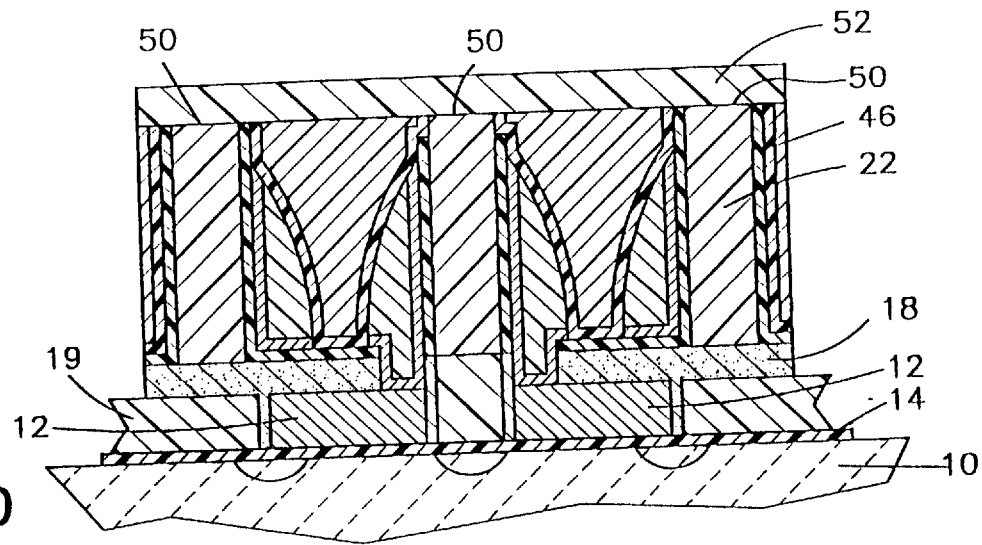

Following the deposit of the silicon nitride 46 a silicon dioxide layer 48 is deposited to fill all of the remaining openings and overlay the encapsulated legs 40 and 42 as shown in FIG. 9. This is then polished to polish all of the horizontal films off the top surface of the silicon dioxide material 22 as shown in FIG. 10.

Figure 11:
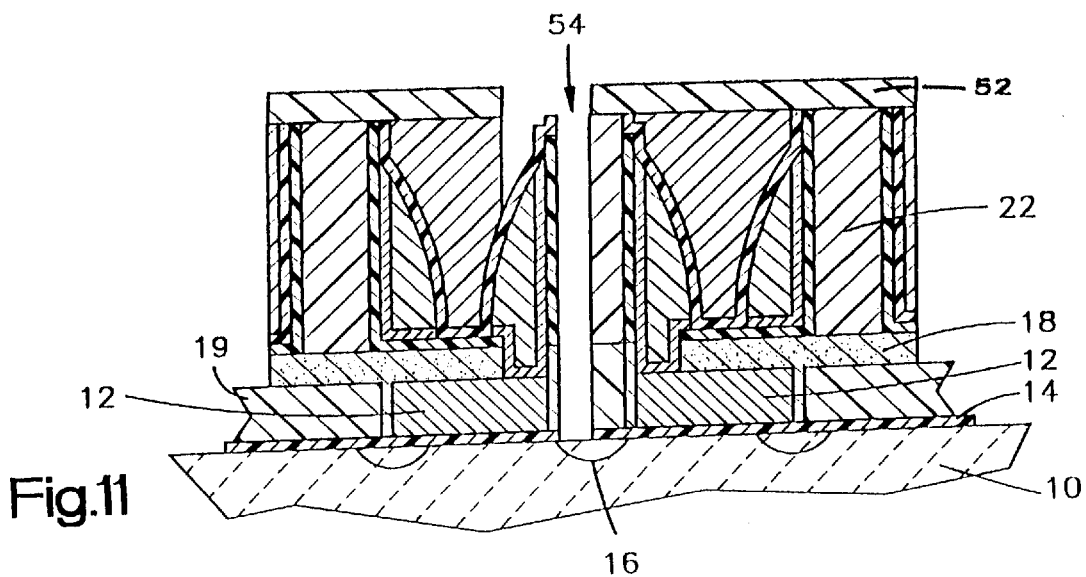

The next step is to provide bitline contact with the source/drain region 16. To this end, silicon dioxide 52 is deposited over the polished surface 50 and then by photoresist and lithographic technique a pattern is exposed and developed to reveal the underlying silicon dioxide surface where the bitline contact is to be formed. The wordline surface is then anisotropically etched to form a bitline contact opening 54. The etching goes down to the source/drain region 16 as shown in FIG. 11. It should be understood that ideally, the bitline contact opening 54 would be etched between the two active wordline legs 40 and 42 on each side of the source/drain region 16. However in practice, since this is not self aligning, many of the openings 54 will actually be formed off center as shown in FIG. 11.

Figure 12:
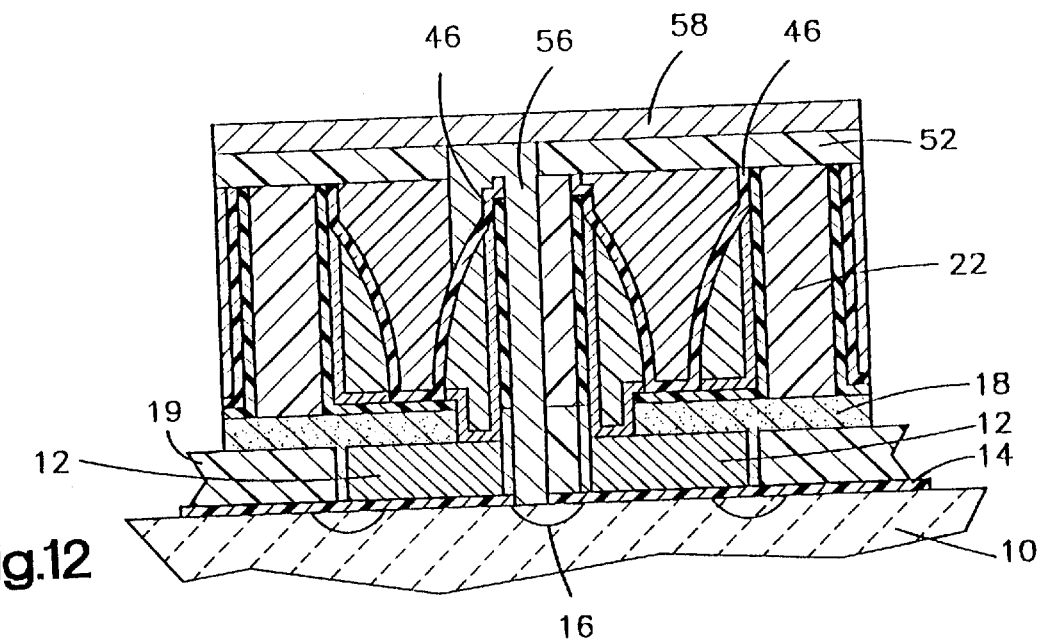

The bitline contact is then formed as shown in FIG. 12. by depositing a conducting material over the horizontal surface of the silicon dioxide 22 and in the bitline contact openings forming bitline contacts 56 in the bitline contact opening 54 and bitline 58 on the horizontal surface of the silicon dioxide 22.

Since the bitline contacts 56 in many instances are off-line or out of center as described above, if the active wordline 40 were not insulated or protected by an insulating material, such as the silicon nitride 46, there would be a direct short between the bitline contact and the active wordline which would cause device failure. Thus by encapsulating the active wordline 40 in silicon nitride, the misalignment of the bitline contact can be tolerated making the bitline contact borderless to the wordline.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed:

1. A semiconductor structure, comprising:

a first device having a gate and a source/drain region, said gate comprising an individual segment of gate conductor on a thin dielectric, said device further comprising a single crystal semiconductor substrate having a source/drain region;

a connector on top of and electrically contacting said segment gate conductor, said connector being a conductive material, said conductive material extending beyond said segment gate conductor;

insulating material completely surrounding said connector except where said connector contacts said segment gate conductor;

a conducting bitline contact member contacting said insulating material surrounding said connector and contacting said source/drain region to thereby mane said contact member borderless to said connector; and a second device, said connector extending to said second device.

2. A semiconductor structure as recited in claim 1, where said connector is on top of said segment gate conductor.

3. A semiconductor structure, as recited in claim 1, wherein said gate conductor comprises polysilicon.

* * * * *